United States Patent
Makihara

(10) Patent No.: US 8,692,556 B2
(45) Date of Patent: Apr. 8, 2014

(54) VOLTAGE DETECTION DEVICE FOR ASSEMBLED BATTERY

(75) Inventor: Tetsuya Makihara, Nukata-gun (JP)

(73) Assignee: DENSO CORPORATION, Kariya (JP)

(*) Notice: Subject to any disclaimer, the term of this patent is extended or adjusted under 35 U.S.C. 154(b) by 307 days.

(21) Appl. No.: 13/307,047

(22) Filed: Nov. 30, 2011

(65) Prior Publication Data

US 2012/0139545 A1 Jun. 7, 2012

(30) Foreign Application Priority Data

Dec. 3, 2010 (JP) ................................. 2010-270262

(51) Int. Cl.
*G01N 27/416* (2006.01)

(52) U.S. Cl.
USPC ............................ 324/426; 324/433; 320/116

(58) Field of Classification Search
USPC ........................... 320/116, 120; 324/426, 433
See application file for complete search history.

(56) References Cited

U.S. PATENT DOCUMENTS

| 6,437,538 | B1 | 8/2002 | Tsurumi et al. |
| 7,663,375 | B2 * | 2/2010 | Yonezawa ..................... 324/434 |
| 2006/0012336 | A1 | 1/2006 | Fujita |
| 2008/0150516 | A1 | 6/2008 | Yonezawa |
| 2009/0058505 | A1 | 3/2009 | Yoshio |

FOREIGN PATENT DOCUMENTS

| JP | A-2001-56350 | 2/2001 |
| JP | A-2002-204537 | 7/2002 |

* cited by examiner

*Primary Examiner* — Samuel Berhanu
(74) *Attorney, Agent, or Firm* — Posz Law Group, PLC

(57) ABSTRACT

An operational amplifier has an input biased at a predetermined reference voltage. A control unit opens both second switches and third switches corresponding to unit batteries being non-detection object, closes fourth switch. The control unit further closes both one of first switches and one of third switches corresponding to one unit battery being a detection object to charge corresponding one of first capacitors. Thereafter, the control unit opens the fourth switch. The control unit further closes one of the second switches corresponding to the one unit battery being the detection object, instead of the one of the first switches. Thus, the control unit detects a voltage of each of the unit batteries.

9 Claims, 12 Drawing Sheets

VOLTAGE DETECTION DEVICE FOR ASSEMBLED BATTERY

CROSS REFERENCE TO RELATED APPLICATIONS

This application is based on and claims priority to Japanese Patent Application No. 2010-270262 filed on Dec. 3, 2010, the contents of which are incorporated in their entirely herein by reference.

TECHNICAL FIELD

The present invention relates to a voltage detection device for an assembled battery including multiple unit batteries connected in series, the voltage detection device being configured to detect the voltage of each unit battery of the assembled battery.

BACKGROUND

A hybrid vehicle or an electric vehicle is equipped with an assembled battery including multiple secondary batteries (unit batteries) connected in series. In such an assembled battery, it is necessary to detect the voltage of each secondary battery cell individually for calculating the capacity of each secondary battery cell and protection management of the secondary battery cell. It is noted that an assembled battery for such an application includes a significantly large number of secondary batteries connected in series. Therefore, the electric potential becomes high in a specific connection position between secondary batteries in the assembled battery. Thus, the voltage detection device for the secondary battery is applied with high voltage.

For example, JP-A-2008-145180 discloses a voltage detection circuit including an operational amplifier, a first capacitor, a second capacitor, a discharge circuit, and switch devices. The first capacitor has one end was connected to the inverting input terminal of the operational amplifier. The second capacitor and the discharge circuit are connected between the inverting input terminal of the operational amplifier and the output terminal of the operational amplifier. The switch devices are respectively connected between the terminal of each of the unit batteries and the other end of the first capacitor. In the configuration of JP-A-2008-145180, the switch device and the discharge circuit between the positive terminal of the unit battery and the first capacitor are activated to charge the first capacitor. Thereafter, in the state where the discharge circuit is deactivated, the switch device between the negative terminal of the unit battery and the first capacitor is activated, instead of the switch device, thereby to detect the voltage of the unit battery.

JP-A-2001-56350 discloses a voltage detection circuit including a capacitor group constructed of multiple capacitors connected in series, correspondingly to the unit batteries. In the configuration of JP-A-2001-56350, each switch device provided in the path between the unit battery and the capacitor is closed to charge the corresponding capacitor by applying the voltage of the unit battery all at once. Thereafter, voltage detection is implemented from the low-voltage side capacitor in order. When the voltage detection of one of the capacitors is completed, the electric charge of the one capacitor is discharged, thereby to successively reduce the electric potential of an undetected capacitor in this way.

The voltage detection circuits disclosed in JP-A-2008-145180 and JP-A-2001-56350 include the operational amplifier and the microcomputer with low-voltage configurations. However, semiconductor switch devices employed in these voltage detection circuits are applied with still high voltage. Therefore, a low-voltage process, such as a 5V system or a 3.3V system cannot be employed in these voltage detection circuits. Consequently, a high-voltage transistor is requisite in such a voltage detection circuit to result in increase in a layout area for the circuit. Thus, manufacturing cost for the voltage detection circuit may increase.

SUMMARY OF THE INVENTION

In view of the foregoing and other problems, it is an object of the present invention to produce a voltage detection device, without a high-voltage transistor, for an assembled battery.

According to an aspect of the present invention, a voltage detection device for an assembled battery including a plurality of unit batteries connected in series, the voltage detection device being configured to detect a voltage of each of the unit batteries of the assembled battery, the voltage detection device comprises an operational amplifier having an input terminal biased at a predetermined reference voltage. The voltage detection device further comprises first capacitors provided respectively to the unit batteries. The voltage detection device further comprises first switch devices each provided between a high-voltage-side terminal of corresponding one of the unit batteries and one end of corresponding one of the first capacitors. The voltage detection device further comprises second switch devices each provided between a low-voltage-side terminal of corresponding one of the unit batteries and the one end of corresponding one of the first capacitors. The voltage detection device further comprises third switch devices each provided between an inverting input terminal of the operational amplifier and an other end of corresponding one of the first capacitors. The voltage detection device further comprises a second capacitor and a fourth switch device provided in parallel between the inverting input terminal of the operational amplifier and an output terminal of the operational amplifier. The voltage detection device further comprises a control unit configured to detect the voltage by implementing the following first and second processes in order: the first process to: open both the second switch devices and the third switch devices corresponding to the unit batteries excluded from an object of voltage detection, close the fourth switch device, and close both one of the first switch devices and one of the third switch devices corresponding to one of the unit batteries being an object of voltage detection to charge corresponding one of the first capacitors; and the second process to: open the fourth switch device, and close one of the second switch devices corresponding to the one of the unit batteries being the object of voltage detection, instead of the one of the first switch devices.

According to another aspect of the present invention, a voltage detection device for an assembled battery including a plurality of unit batteries connected in series, the voltage detection device being configured to detect a voltage of each of the unit batteries of the assembled battery, the voltage detection device comprises an operational amplifier having an input terminal biased at a predetermined reference voltage. The voltage detection device further comprises first capacitors provided respectively to the unit batteries. The voltage detection device further comprises first switch devices each provided between a high-voltage-side terminal of corresponding one of the unit batteries and one end of corresponding one of the first capacitors. The voltage detection device further comprises second switch devices each provided between a low-voltage-side terminal of corresponding one of the unit batteries and the one end of corresponding one of the first capacitors. The voltage detection device further comprises third switch device each provided between an inverting input terminal of the operational amplifier and an other end of corresponding one of the first capacitors. The voltage detection device further comprises a fourth A switch device provided in parallel between the inverting input terminal of the operational amplifier and an output terminal of the operational amplifier. The voltage detection device further comprises a second capacitor and a fourth B switch device provided in series between the inverting input terminal of the operational amplifier and the output terminal of the operational amplifier. The voltage detection device further comprises a fourth C switch device provided between a common connection point, which is between the second capacitor and the fourth B switch device, and a voltage line applied with a constant voltage. The voltage detection device further comprises a control unit configured to detect the voltage by implementing the following first and second processes in order: the first process to: open both the second switch devices and the third switch devices corresponding to the unit batteries excluded from an object of voltage detection; close both the fourth A switch device and the fourth C switch device; open the fourth B switch device; and close both one of the first switch devices and one of the third switch devices corresponding to one of the unit batteries being an object of voltage detection to charge corresponding one of the first capacitors; and the second process to: open both the fourth A switch device and the fourth C switch device; close the fourth B switch device; and close one of the second switch devices corresponding to the one of the unit batteries being the object of voltage detection, instead of the one of the first switch devices.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION (First Embodiment)

Figure 1:
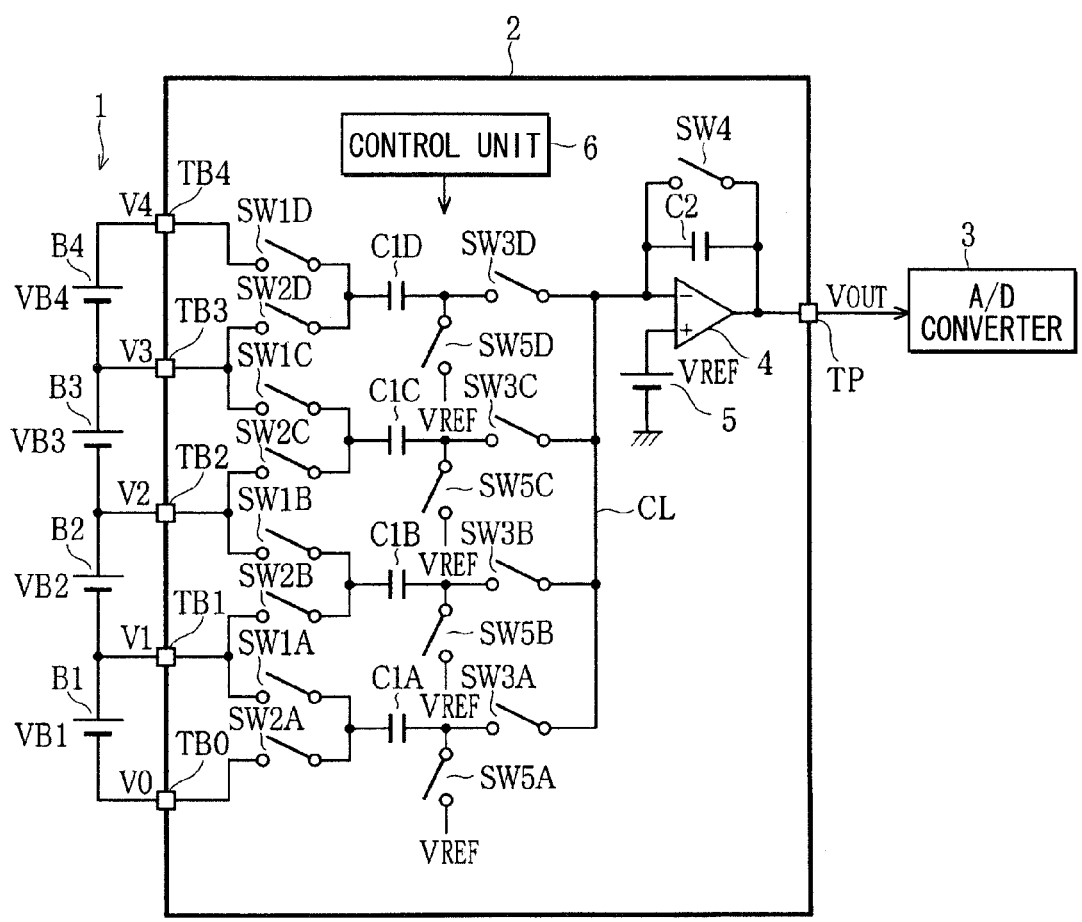
FIG. 1 is a block diagram showing the voltage detection device according to the first embodiment.

As follows, the present embodiment will be described with reference to FIGS. 1 to 6. FIG. 1 shows a configuration of a voltage detection device for an assembled battery. The assembled battery 1 is equipped in a hybrid vehicle or an electric vehicle and configured to supply electricity to an electric motor through an inverter. An actual assembled battery 1 includes, for example, a large number of lithium secondary batteries, a nickel hydride secondary batteries (unit batteries), and the like connected in series. In the present example, a battery cell B1 on the low-voltage side to a battery cell B4 on the high-voltage side are shown in consideration of convenience of explanation.

The battery cells of the lithium secondary battery may vary in the charging state (state of charge: SOC) and the cell voltage due to individual difference in capacity of the battery cells, difference in the self-electric discharge characteristic of the battery cells, and the like. In such an assembled battery 1, it is necessary to detect the voltage of each secondary battery cell individually for calculating the capacity of each secondary battery cell and protection management of the secondary battery cell to implement, for example, equalization of the battery voltages. The terminals TB0 to TB4 of the voltage detection device 2 for the assembled battery 1 are respectively connected with the terminals of the battery cells B1 to B4. The voltages of the terminals TB0 to TB4 are respectively denoted by V0 to V4. The voltage detection device 2 detects the voltage BVn (n=1, 2, 3, 4) of each battery cell Bn (n=1, 2, 3, 4) of the assembled battery 1 and outputs the detection voltage denoted by VOUT to an A/D conversion device 3 through the output terminal TP.

The voltage detection device 2 may be an integrated circuit (IC) integrated together with a circuit such as the A/D conversion device 3. The voltage detection device 2 includes an operational amplifier 4 configured to operate with application of the power supply voltage VDD specified relative to the grand electric potential VSS. The noninverting input terminal of the operational amplifier 4 is biased by the voltage generation circuit 5 to the reference voltage VREF. The second capacitor C2 and the fourth switch device SW4 are connected in parallel between the inverting input terminal of the operational amplifier 4 and the output terminal of the operational amplifier 4.

A charge switch circuit having the identical configuration is provided between the terminal TBn and the operational amplifier 4 for each battery cell Bn. For example, the charge switch circuit for the battery cell B4 includes the first switch device SW1D and the second switch device SW2D connected among the high-voltage-side terminal TB4 of the battery cell B4, the low-voltage-side terminal TB3 of the battery cell B4, and one end of the first capacitor C1D. The third switch device SW3D for selecting a battery cell is connected between the common line CL connected with the inverting input terminal of the operational amplifier 4 and the other end of the capacitor C1D. The other end of the capacitor C1D is configured to receive application of the voltage VREF for voltage clamp, which is set to be equal to the reference voltage, through the fifth switch device SW5D.

Similarly, the charge switch circuit corresponding to the other battery cell Bn includes the first capacitor C1x, the first switch device SW1x, the second switch device SW2x, the third switch device SW3x, and the fifth switch device SW5x. The suffix x corresponds to 1, 2, 3, 4 of the above-noted n, in the order of A, B, C, D from the low-voltage side of the charge switch circuit. Each switch device includes, for example, a MOS transistor. The control circuit (control unit) 6 implements switching operation of the switch devices.

Figure 2:
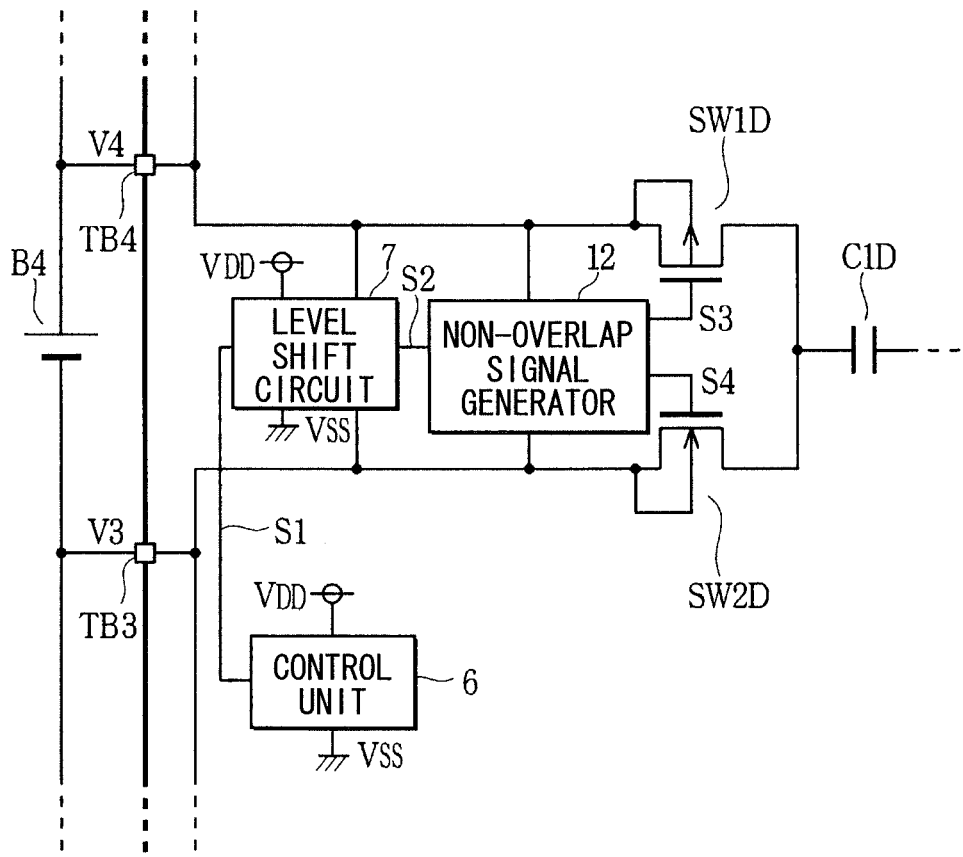
FIG. 2 is a block diagram showing the first switch device, the second switch device, and the drive circuit.
Figure 3:
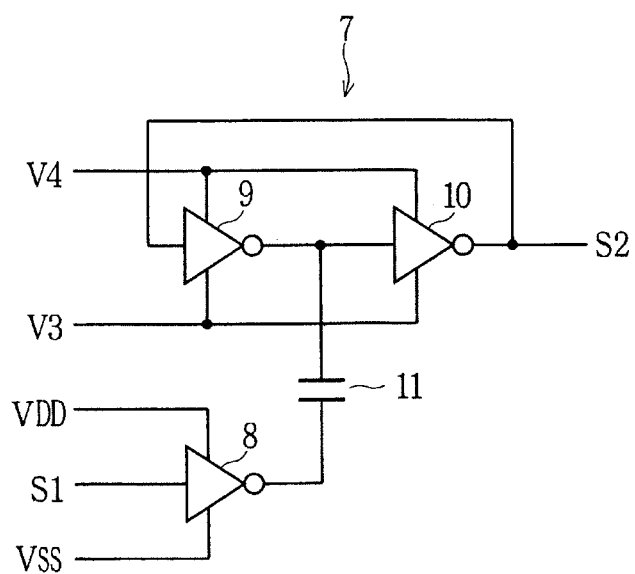
FIG. 3 is a block diagram showing the level shift circuit.

FIG. 2 shows a configuration of the first switch device SW1D and the second switch device SW2D, which are located on the assembled battery side and located on both sides of the first capacitor C1x, and the drive circuit for the first switch device SW1D and the second switch device SW2D. The level shift circuit 7 functions to insulate and level shift the signal S1 relative to the grand electric potential VSS being the reference potential outputted from control circuit 6. Similarly to the control circuit 6, as shown in FIG. 3, the level shift circuit 7 includes the inverter 8, inverters 9, 10, and the capacitor 11. The inverter 8 operates with application of the power supply voltage VDD relative to the grand potential being the reference potential. The inverters 9, 10 operate with application of the voltage VB4 (=V4−V3) of the battery cell B4 relative to the electric potential V3 of the terminal TB3 being the reference potential. The capacitor 11 insulates both the reference potential circuits therebetween. The inverters 9, 10 are connected in a ring shape. The capacitor 11 is connected between the output terminal of the inverter 8 and the input terminal of the inverter 10.

When the signal S1 is inputted into the inverter 8 thereby to change the level of the signal S1, the input electric potential of the inverter 10 is changed through the capacitor 11. In this way, the input level of the inverter 10 exceeds a threshold, thereby to invert the output signal S2 of the inverter 10. The signal S2 is inverted through the inverter 9 and applied to the input terminal of the inverter 10. Thus, the signal S2 is outputted in a stable manner. A drive circuit with the grand electric potential VSS as the reference potential can be used for the third switch device SW3x, the fourth switch device SW4, and the fifth switch device SW5x, and therefore, the level shift circuit 7 is unnecessary.

Figure 4:
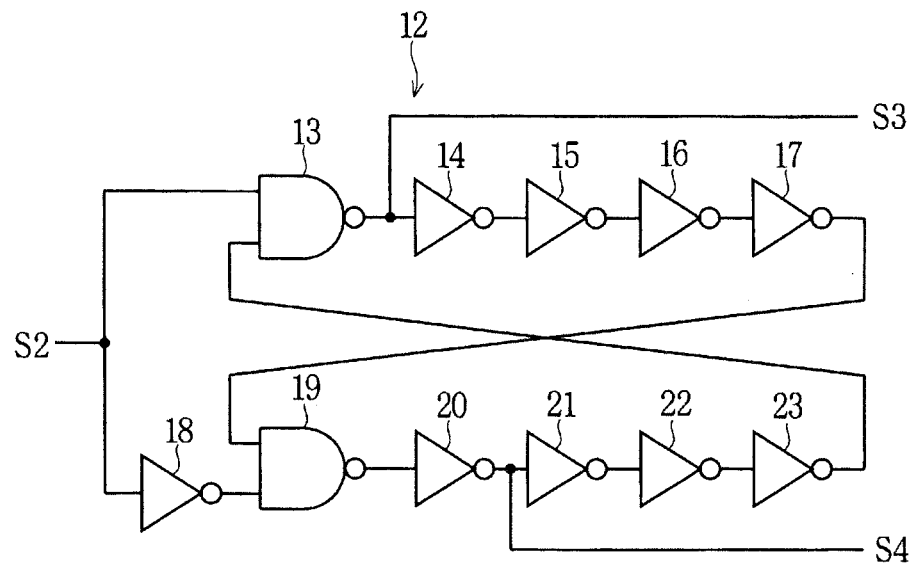
FIG. 4 is a block diagram showing the non-overlap signal generation circuit.

As shown in FIG. 1, the switch devices SW1D and SW2D are, for example, a low-voltage PMOS transistor and a low-voltage NMOS transistor respectively. Referring to FIG. 4, a non-overlap signal generation circuit 12 inputs the signal S2, generates the driving signals S3, S4. Referring to FIG. 2, the non-overlap signal generation circuit 12 outputs the generated driving signal S3, S4 to the switch devices SW1D, SW2D, thereby to activate only one of the switch devices SW1D, SW2D according to the generated level.

Referring to FIG. 4, the non-overlap signal generation circuit 12 includes the series circuit, which includes the NAND gate 13, inverters 14 to 17, an inverter 18, and the series circuit, which includes the NAND gate 19 and inverters 20 to 23. The inverters 14 to 17, 20 to 23 are provided to generate a time delay. The output terminal of the inverter 17 is connected to the input terminal of the NAND gate 19. The output terminal of the inverter 23 is connected to the input terminal of the NAND gate 13.

Figure 5:
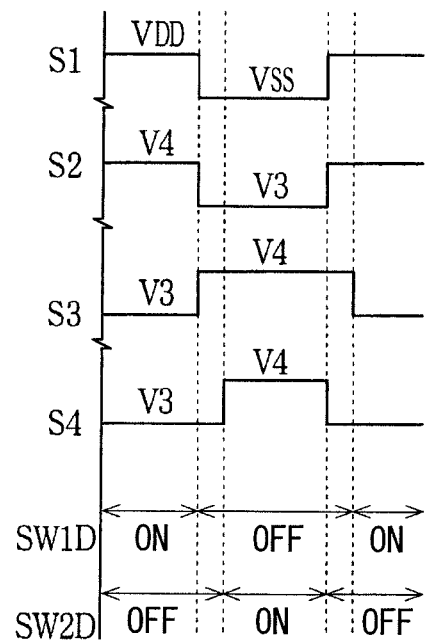
FIG. 5 is a timing chart showing the waveforms of the non-overlap signal generation circuit.

FIG. 5 is a timing chart showing an operation of the switch device drive circuit. In the non-overlap signal generation circuit 12, when the signal S2 inputted into the NAND gate 13 and the inverter 18 is L level (voltage V3), the driving signals S3, S4 are set to H level (voltage V4). Alternatively, when the signal S2 is H level, the driving signals S3, S4 are set to L level. When the level of the signal S2 changes, a non-overlap period, when the driving signal S3 becomes H level and when the driving signal S4 becomes L level, occurs. Therefore, simultaneous ON (activation) of the switch devices SW1D, SW2D can be restricted.

Figure 6:
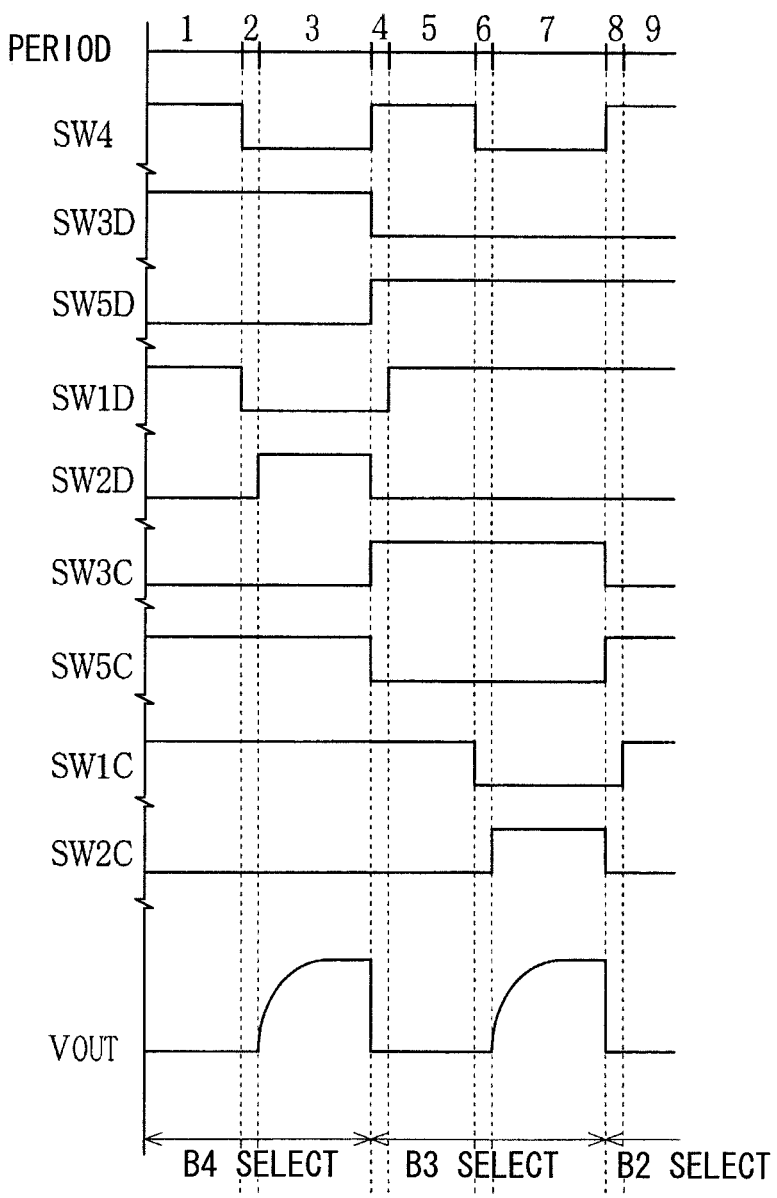
FIG. 6 is a timing chart showing the waveforms representing the ON/OFF states of the switch devices and the output voltage.

Subsequently, the operation and effect of the present embodiment will be described with reference to FIG. 6. The control circuit 6 repeatedly switches the switch devices and detects the cell voltages VB1 to VB4 in the descending order. Thus, the control circuit 6 outputs the detected cell voltages VB1 to VB4 to the A/D conversion device 3. FIG. 6 shows waveforms representing the ON/OFF states of the switch devices and the output voltage VOUT. In FIG. 6, the high level represents the ON state (activated), and the low level represents the OFF state (deactivated). As follows, an example of detection of the voltage VB4 of the battery cell B4 for each period represented in FIG. 6 will be described.

[Period 1]

The control circuit 6 deactivates (turns OFF) the third switch devices SW3A to SW3C corresponding to the battery cells B1 to B3 being excluded from the voltage detection. Thus, the other ends of the first capacitor C1A to C1C are disconnected from the common line CL. The fifth switch devices SW5A to SW5C are activated (turned ON) to apply the reference voltage VREF to the other ends of the disconnected first capacitors C1A to C1C thereby to fix its electric potential. The one ends of the first capacitors C1A to C1C may be disconnected from the battery cells B1 to B3. In the present example, the first switch devices SW1A to SW1C are activated in order to shorten the charge time period when detection of the voltage is implemented later.

The control circuit 6 activates the first switch device SW1D and the third switch device SW3D corresponding to the battery cell B4 being the object of the voltage detection. Thereby, the control circuit 6 connects the first capacitor C1D between the terminal TB4 and the common line CL. In addition, the control circuit 6 activates the fourth switch device SW4 to initialize the electric charge of the second capacitor C2 to zero. Thus, the operational amplifier 4 is in the voltage follower connected state with the input of the reference voltage VREF. Therefore, the output voltage VOUT becomes the VREF, and the first capacitor C1D is charged with the voltage between the V4 and the VREF.

In the present state, the SW2A to SW2D in the OFF state (deactivated) are applied with the voltages VB1 to VB4 of the battery cells B1 to B4 respectively. In addition, the deference voltage VREF and the voltage VREF for voltage clamp are equal to each other. Therefore, voltage is not applied to the switch devices SW3A to SW3C and SW5D. The input terminal of the operational amplifier 4 is applied with the reference voltage VREF, which is set to be lower than the power supply voltage VDD.

[Period 2]

The period 2 is a non-overlap period in which the first switch device SW1D and the second switch device SW2D are simultaneously deactivated. The control circuit 6 deactivates the fourth switch device SW4.

[Period 3]

The control circuit 6 activates the second switch device SW2D, instead of the first switch device SW1D deactivated in the period 2. The one end of the first capacitor C1D is applied with the voltage V3, instead of the voltage V4. In the present state, the electric charge accumulated in the first capacitor C1D in the period 1 is redistributed with the second capacitor C2. The general formula (1) represents conservation of electric charge between the period 2 and the period 3 with the capacitance C1 of the first capacitor and the capacitance C2 of the second capacitor. The battery cell B4 is related to the Vn=V4 and the Vn−1=V3.

$$C1(Vn-VREF)=C1(Vn-1-VREF)+C2(VOUT-VREF) \quad (1)$$

The following formula (2) is derived from the formula (1).

$$VOUT=C1/C2(Vn-Vn-1)+VREF \quad (2)$$

That is, subsequent to the redistribution of the electric charge, the output voltage VOUT of the operational amplifier becomes the voltage calculated by multiplying the terminal voltage of the battery cell B4 by C1/C2 and being offset with the reference voltage VREF. The terminal voltage of the battery cell B4 is equal to the voltage VB4 of the battery cell B4. Even in the present state, the SW2A to SW2C and SW1D in the OFF state (deactivated) are applied with the voltages VB1 to VB4 of the battery cells B1 to B4 respectively.

[Period 4]

The control circuit 6 switches the battery cell being the object of the voltage detection from the B4 to the B3. Specifically, about the battery cell B4 being excluded from the voltage detection, the control circuit 6 deactivates the third switch device SW3D thereby to disconnect the first capacitor C1D from the common line CL. In addition, the control circuit 6 deactivates the second switch device SW2D and activates the fifth switch device SW5D. The non-overlap signal generation circuit 12 functions to deactivate simultaneously the first switch device SW1D and the second switch device SW2D.

About the battery cell B3 being the object of the voltage detection, the control circuit 6 maintains the state where the first switch device SW1C is activated and the second switch device SW2C is deactivated. In addition, the control circuit 6 activates the third switch device SW3C to connect the first capacitor C1C with the common line CL. The control circuit 6 further deactivates the fifth switch device SW5C. The control circuit 6 further activates the fourth switch device SW4. In this way, the output voltage VOUT becomes the VREF, similarly to the period 1. Thus, the first capacitor C1C is charged with the voltage between the V3 and the VREF. The first capacitor C1C is already charged with the voltage in the periods 1 to 3. Therefore, the time widths of the periods 4, 5 are short.

In this case, the switch devices SW2D, SW3A, SW3B, SW3D, SW5C being in the OFF state are not applied with the voltage. The switch devices SW2A to SW 2C and SW1D are applied with the voltages VB1 to VB4 of the battery cells B1 to B4 respectively.

[Period 5 and After]

It corresponds to the period 1. The operation is similar to that of the period 4. Specifically, the first switch device SW1D is activated to preliminary charge the first capacitor C1D with the voltage between the V4 and the VREF. The operations in the periods 6, 7, 8 are similar to those in the periods 2, 3, 4, and explanations of the operations are omitted.

According to the present embodiment, the first capacitor C1$x$ ($x$=A, B, C, D) provided to each battery cell Bn (n=1, 2, 3, 4) insulates the battery-side circuit from the operational-amplifier-side circuit to be applied with the voltage difference between both the circuits. In addition, only the operational-amplifier-side circuit connects the third switch devices SW3$x$ therebetween via the common line CL. Therefore, the switch devices SW1$x$, SW2$x$ of the battery-side circuit is applied with only the voltage less than the voltage VBn of the single battery cell. In addition, the reference voltage and the voltage for voltage clamp are set to be equal to each other. Therefore, the switch devices SW3$x$, SW5$x$ of the operational-amplifier-side circuit are not applied with voltage. In addition, the switch device SW4 is applied with only the voltage less than the power supply voltage VDD. That is, the operational amplifier 4 and all the switch devices can be low-voltage transistors.

The first capacitor C1$x$ needs a high resistance to receive a high voltage greater than the power supply voltage VDD. It is noted that the first capacitor C1$x$ may be formed by utilizing an interlayer insulation film of a metal wiring to secure such a high resistance. Thus, it is unnecessary to employ an exclusive manufacturing process. Thus, the voltage detection device 2 being an IC can be constructed of low-voltage transistors, such as a 5V-system transistor and 3.3V-system transistor, without use of a high-voltage transistor. Thus, the layout area for the voltage detection device 2 can be reduced in this way, thereby to reduce the manufacturing cost.

Furthermore, the fifth switch device SW5$x$ is provided to the other-end side of the first capacitor C1$x$ thereby to enable activation of the fifth switch device SW5$x$ corresponding to the battery cell Bn, which is excluded from the object of the voltage detection. Therefore, the electric potential of the other end of the first capacitor C1$x$ can be clamped. In the present state, the first switch device SW1$x$ is also activated. Therefore, in the period in which the battery cell Bn is excluded from the object of the voltage detection, the first capacitor C1$x$ can be beforehand charged with the voltage difference between the voltage VBn of the unit battery and the voltage VREF for the voltage clamp. In this way, when the battery cell Bn becomes the object of the voltage detection, the charge time for the first capacitor C1$x$ can be reduced.

As described above, the voltage for voltage clamp is set to be equal to the reference voltage. Therefore, with the preliminary charge of the first capacitor C1$x$, when the battery cell Bn becomes the object for the voltage detection, electric charge equal to the electric charge charged by the first capacitor C1$x$ is charged. Therefore, the charge time for the first capacitor C1$x$ can be reduced to substantially zero.

(Second Embodiment)

Figure 7:
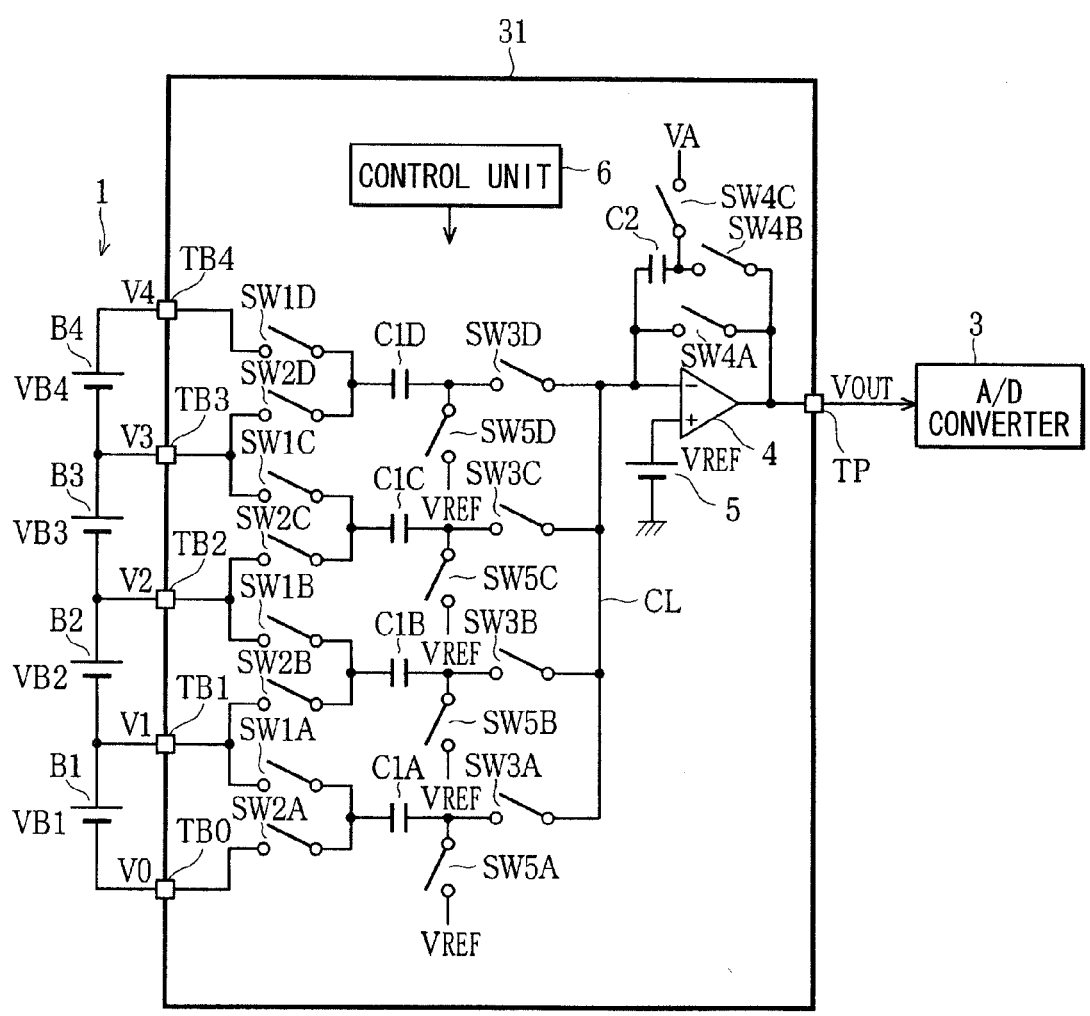
FIG. 7 is a block diagram showing the voltage detection device according to the second embodiment.

Subsequently, the second embodiment will be described with reference to FIGS. 7, 8. In the voltage detection device 31 according to the present embodiment, the configuration of the fourth switch device is modified, compared with that of the first embodiment in order to eliminate influence of the offset voltage of the operational amplifier 4. The fourth A switch device SW4A is connected between the inverting input terminal of the operational amplifier 4 and the output terminal of the operational amplifier 4. In addition, a series circuit including the second capacitor C2 and the fourth B switch device SW4B is connected in parallel with the fourth A switch device SW4A. The fourth C switch device SW4C is connected between the common connection point, which is between the second capacitor C2 and the fourth B switch device SW4B, and the voltage line applied with the constant voltage VA. The control circuit 6 controls regularly the fourth A switch device SW4A and the fourth C switch device SW4C in the same state. The configuration other than that is similar to the configuration of the voltage detection device 2.

Figure 8:
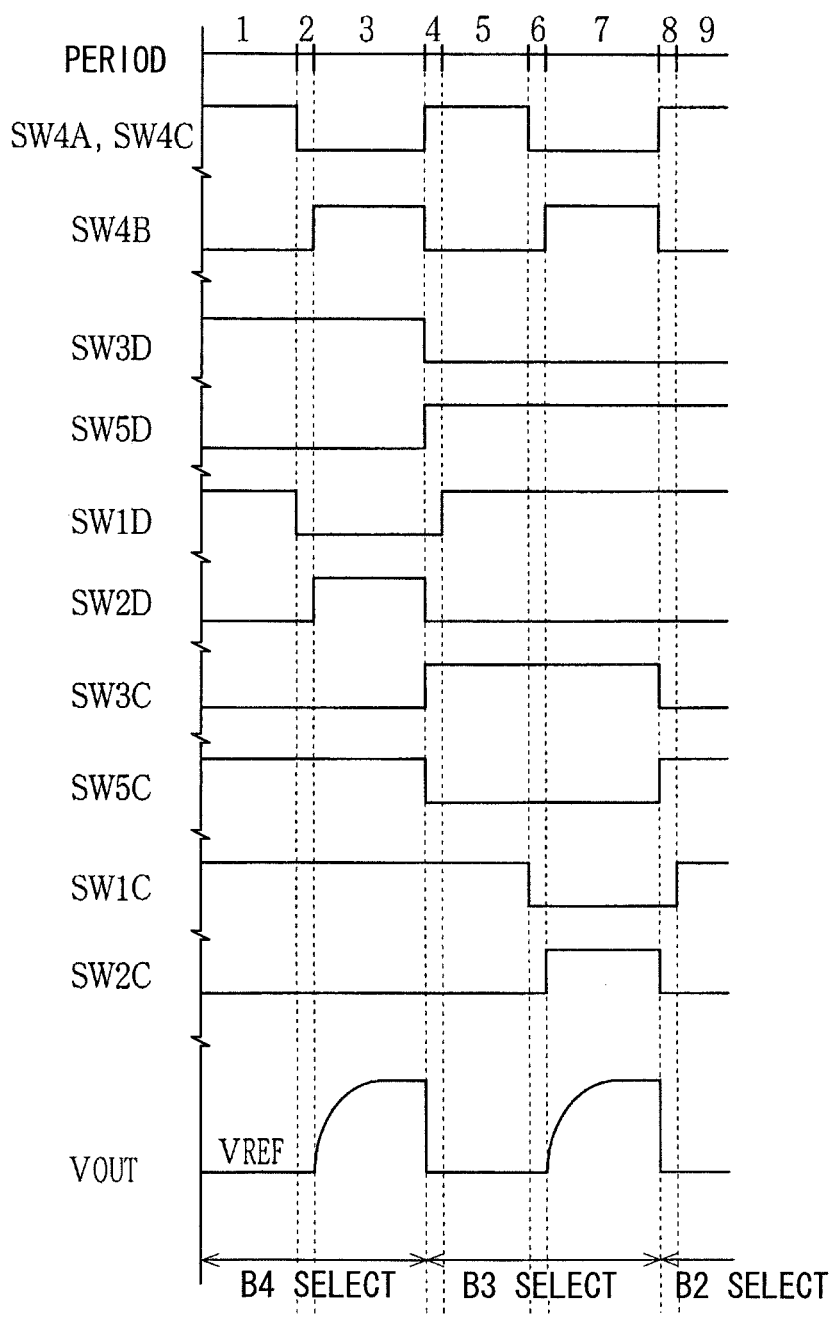
FIG. 8 is a timing chart showing the waveforms representing the ON/OFF states of the switch devices and the output voltage, according to the second embodiment.

FIG. 8 shows waveforms representing the ON/OFF states of the switch devices and the output voltage VOUT. As follows, an example of detection of the voltage VB4 of the battery cell B4 different from that of the first embodiment will be described. In the period 1, the control circuit 6 activates the fourth A switch device SW4A and the fourth C switch device SW4C and deactivates the fourth B switch device SW4B. In this way, the second capacitor C2 is initialized with the electric charge according to the voltage between the VA and the VREF. Thus, the operational amplifier 4 is in the voltage follower connected state with input of the reference voltage VREF. Therefore, the output voltage VOUT becomes the VREF. Thus, the first capacitor C1D is charged with the voltage between the V4 and the VREF.

In the period 2, the control circuit 6 deactivates the fourth A switch device SW4A and the fourth C switch device SW4C. In the period 3, the control circuit 6 activates the fourth B switch device SW4B. In the present state, the electric charge accumulated in the first capacitor C1D in the period 1 is redistributed with the second capacitor C2. The general formula (3) represents conservation of electric charge between the period 2 and the period 3. The formula (4) is derived from the general formula (3).

$$C1(Vn-VREF)+C2(VA-VREF)=C1(Vn-1-VREF)+C2(VOUT-VREF) \quad (3)$$

$$VOUT=C1/C2(Vn-Vn-1)+VA \quad (4)$$

As follows, a numerical example with possible voltage VA will be described. The formulas (5), (6) are derived with a voltage range from the Vmin to the Vmax in which the output of the operational amplifier 4 is changeable.

$$Vmin \le C1/C2(Vn-Vn-1)+VA \le Vmax \quad (5)$$

$$Vmin-C1/C2(Vn-Vn-1) \le VA \le Vmax-C1/C2(Vn-Vn-1) \quad (6)$$

The formula (7) is derived from the formula (6) on assumption that C1=C2, Vmin=0V, and Vmax=5V.

$$-(Vn-Vn-1) \le VA \le 5-(Vn-Vn-1) \quad (7)$$

The Vn−Vn−1 is the voltage VBn of the battery cell Bn. For example, on assumption that the battery is a lithium secondary battery, and the minimum voltage of the Vn−Vn−1 is 0V, and the maximum voltage of the Vn−Vn−1 is 5V, the value VA, which satisfies the condition of the formula (7), is calculated to 0V.

In general, an operational amplifier has an offset voltage. Therefore, in consideration of the offset voltage ΔVOS of the operational amplifier 4, the present embodiment will be described with reference to the first embodiment. In this case, the conservation of electric charge of the present embodiment is represented by the formula (8). The offset voltage ΔVOS is cancelled by modifying the formula (8). Thus, a formula same as the formula (4) can be derived from the formula (8).

$$C1(Vn-VREF+\Delta VOS)+C2(VA-VREF+\Delta VOS)=C1(Vn-1-VREF+\Delta VOS)+C2(VOUT-VREF+\Delta VOS) \quad (8)$$

On the other hand, the conservation of electric charge of the first embodiment in consideration of the offset voltage ΔVOS is represented by the formula (9). Thus, the formula (10) including the offset voltage ΔVOS is derived from the formula (9).

$$C1(Vn-VREF+\Delta VOS)=C1(Vn-1-VREF+\Delta VOS)+C2(VOUT-VREF+\Delta VOS) \quad (9)$$

$$VOUT=C1/C2(Vn-Vn-1)+VREF-\Delta VOS \quad (10)$$

As described above, according to the present embodiment, the fourth switch device includes the fourth A switch device SW4A to the fourth C switch device SW4C. With the present configuration, influence of the offset voltage ΔVOS of the operational amplifier 4 can be eliminated from the detection voltage of the cell voltage VBn. Therefore, the voltage detection can be implemented with high accuracy.

(Third Embodiment)

Figure 9:
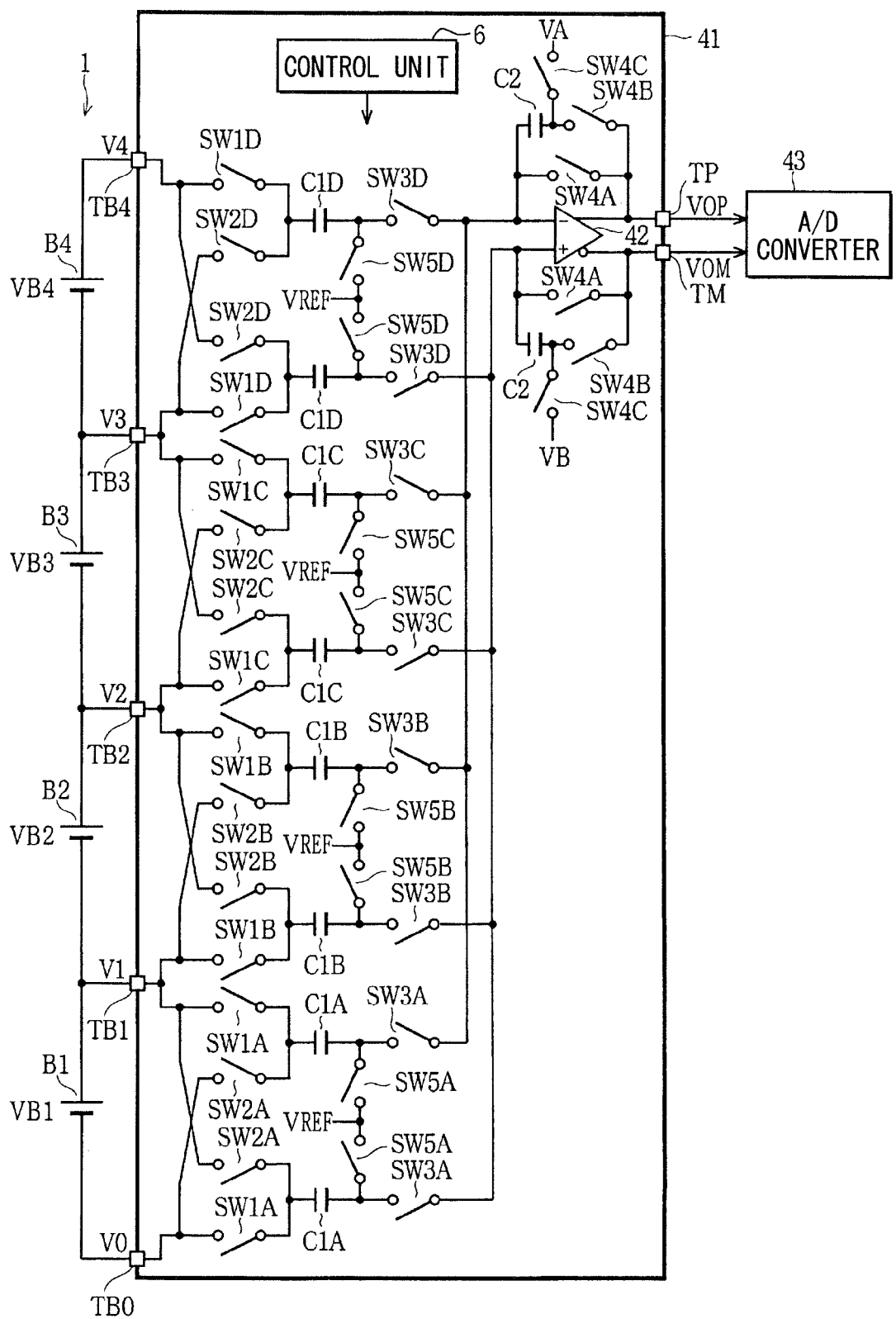
FIG. 9 is a block diagram showing the voltage detection device according to the third embodiment.

Subsequently, the third embodiment will be described with reference to FIGS. 9 to 11. The voltage detection device 41 of the present embodiment employs the operational amplifier 42 having a differential output configuration. In the present embodiment, the voltage detection device 31 of the second embodiment is modified to have a fully-differential-type configuration. The common voltage VCOM of the operational amplifier 42 is set to be equal to the reference voltage VREF. The operational amplifier 42 outputs differential voltages VOP, VOM respectively from the noninverting output terminal and the inverted output terminal. The differential voltages VOP, VOM outputted from the output terminals TP, TM are converted by the A/D conversion device 43 having a of difference input configuration into digital data.

The circuit of the operational amplifier 42 on the side of the inverting input terminal and the noninverting output terminal and the circuit of the operational amplifier 42 on the side of the noninverting input terminal and the inverting output terminal form a symmetrical circuit. The voltage detection device 41 includes the first capacitors C1x, the second capacitors C2, the switch devices SW1x to SW3x, SW5x, and the switch devices SW4A to SW4C connected with each other similarly to those of the voltage detection device 31. The suffix x denotes A, B, C, D in this order from the charge switch circuit on the low-voltage side. On the side of the noninverting input terminal side and the inverting output terminal side of the operational amplifier 42, the first and second switch devices SW1x and SW2x are connected between the low-voltage-side terminal and the high-voltage-side terminal of the battery cell Bn corresponding to the first capacitor C1x and the one end of the first capacitor C1x.

Figure 10:
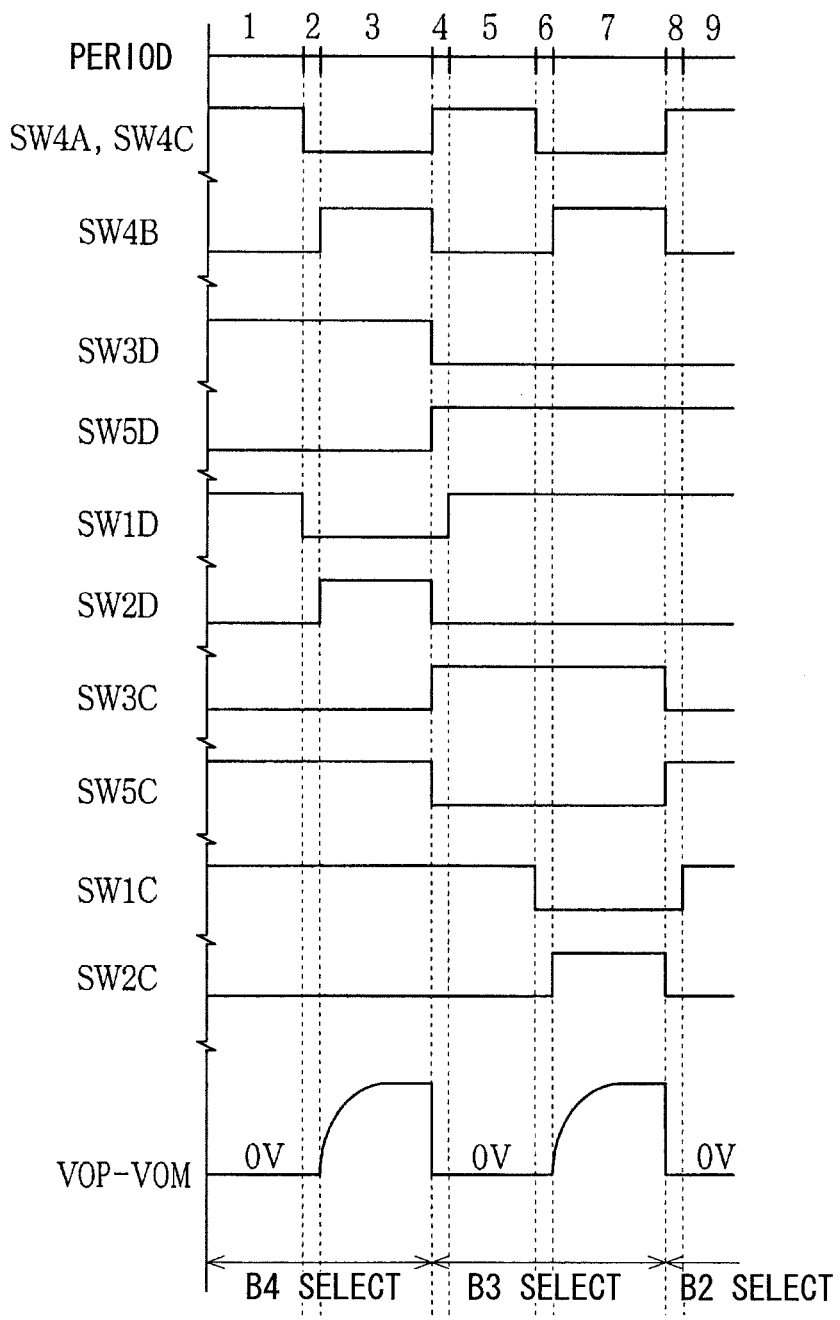
FIG. 10 is a timing chart showing the waveforms representing the ON/OFF states of the switch devices and the output voltage, according to the third embodiment.
Figure 11:
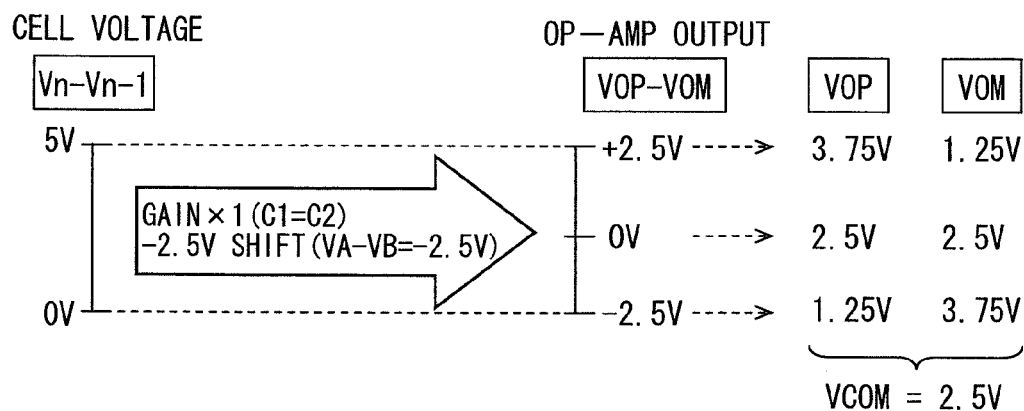
FIG. 11 is a view showing a relationship between the cell voltage and the differential output voltage.

FIG. 10 shows waveforms representing the ON/OFF states of the switch devices and the differential output voltage VOP−VOM. The control of the switch devices is similar to that of the second embodiment. Dissimilarly to the formula (11) and the formula (12), the general formula (13) of conservation of electric charge in the period 2 and the period 3 is derived by subtracting the formula (12) from the formula (11). The value VX is the common voltage on the input side.

$$C1(Vn-VCOM)+C2(VA-VCOM)=C1(Vn-1-VX)+C2(VOP-VX) \quad (11)$$

$$C1(Vn-1-VCOM)+C2(VB-VCOM)=C1(Vn-VX)+C2(VOM-VX) \quad (12)$$

$$VOP-VOM=2C1/C2(Vn-Vn-1)+(VA-VB) \quad (13)$$

When common mode noise ΔV is overlapped on the assembled battery 1 when electric charge is redistributed in the period 3, the general formula of conservation of electric charge becomes the formula (14) and the formula (15). The terms of the ΔV are cancelled by subtracting the formula (15) from the formula (14). Thus, the same result as that of the formula (13) is derived. That is, the voltage detection device 41 has the fully-differential configuration. Therefore, even when common mode noise ΔV is overlapped on the assembled battery 1 during the electric charge redistribution, influence to the differential output voltage VOP−VOM is cancelled.

$$C1(Vn-VCOM)+C2(VA-VCOM)=C1(Vn-1+\Delta V-VX)+C2(VOP-VX) \quad (14)$$

$$C1(Vn-1-VCOM)+C2(VB-VCOM)=C1(Vn+\Delta V-VX)+C2(VOM-VX) \quad (15)$$

The general formula (11) of conservation of electric charge is modified to the formula (16) in consideration of the offset voltage VOS of the operational amplifier 42. The terms of the ΔVOS are cancelled by subtracting the formula (12) from the formula (16). Thus, the same result as that of the formula (13) is derived. That is, similarly to the second embodiment, the voltage detection device 41 enables cancellation of the influence of the offset voltage ΔVOS of the operational amplifier 42.

$$C1(Vn-VCOM+VOS)+C2(VA-VCOM+VOS)=C1(Vn-1-VX+VOS)+C2(VOP-VX+VOS) \quad (16)$$

As follows, an example of setting of the voltages VA, VB will be described with reference to FIG. 11. In general, when an output of an operational amplifier is swung close to the power-supply-voltage VDD or close to the grand voltage VSS, a gain property, a band property, and/or the like may be degraded. In consideration of this, an intermediate level between the power supply voltage VDD and the grand voltage VSS is set as a common voltage, and the output of an operational amplifier is swung in a range such that the properties of the operational amplifier can be secured.

For example, it is assumed that the cell voltage Vn−Vn−1 is changed in a range between 0V and 5V, the power supply voltage VDD of the operational amplifier 42 is 5V, and the gain of the voltage detection device 41 is one time (single multiplication rate, i.e., C1=C2). It suffices that VA−VB=−2.5V to control the output voltage of the operational amplifier 42, such that the median 2.5V of the cell voltage Vn−Vn−1 becomes the intermediate level 2.5V between the power supply voltage VDD and the grand voltage VSS. In this case, the output voltages VOP, VOM are swung only in the range between 1.25V and 3.75V. Therefore, sufficient margin can be secured relative to the grand voltage VSS and the power supply voltage VDD.

As described above, the voltage detection device 41 according to the present embodiment has the fully-differential configuration. Therefore, when a common mode noise is overlapped on the assembled battery 1 during the charge of the first capacitor C1x and even when a common mode noise is overlapped on the assembled battery 1 during the electric charge redistribution, the common mode noise can be cancelled from the differential output voltage VOP−VOM of the operational amplifier 42. Furthermore, the symmetrical circuit configuration is employed. Therefore, an error such as feed-through occurring during switching of each switch device can be cancelled. Thus, the voltage detection can be implemented with high accuracy. Furthermore, influence of the offset voltage ΔVOS of the operational amplifier 42 can be eliminated. Therefore, the voltage detection can be implemented with high accuracy.

(Fourth Embodiment)

Figure 12:
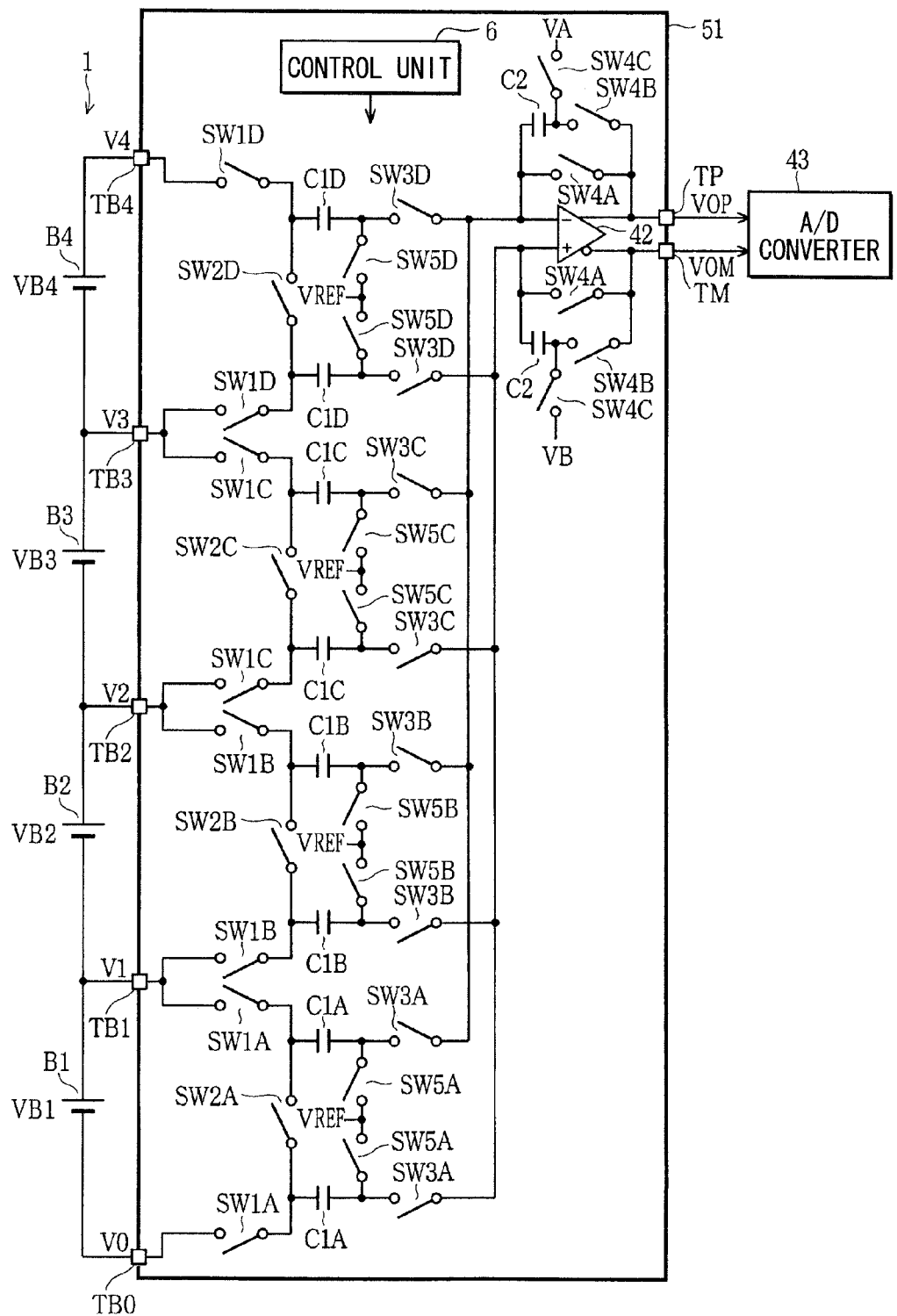
FIG. 12 is a block diagram showing the voltage detection device according to the fourth embodiment.

Subsequently, the fourth embodiment will be described with reference to FIG. 12. The voltage detection device 51 according to the present embodiment includes second switch devices having a modified configuration of the second switch devices of the third embodiment. Specifically, in the present configuration, the second switch devices SW2x are not provided respectively to the side of the inverting input terminal and the noninverting output terminal of the operational amplifier 42 and the side of the noninverting input terminal and the inverting output terminal of the operational amplifier 42. In the present configuration, the common second switch device SW2x is provided between the one ends of the first capacitors C1x provided to the inverting input terminal of the operational amplifier 42 and the noninverting input terminal side of the operational amplifier 42 respectively. The configuration other than that and the ON/OFF (activation and deactivation) control of the switch devices are similar to those of the voltage detection device 41.

The general formula (17) and the general formula (18) of conservation of electric charge in the period 2 and the period 3 are derived on assumption that the voltage of the connection node between the two first capacitors C1x is VY in the period 3 in which the second switch device SW2x is activated. The formula (19) is derived by subtracting the formula (18) from the formula (17). That is, when a capacity ratio is controlled, the differential output voltage VOP−VOM is similar to that of the formula (13) of the third embodiment.

$$C1(Vn-VCOM)+C2(VA-VCOM)=C1(VY-VX)+C2(VOP-VX) \quad (17)$$

$$C1(Vn-1-VCOM)+C2(VB-VCOM)=C1(VY-VX)+C2(VOM-VX) \quad (18)$$

$$VOP-VOM=C1/C2(Vn-Vn-1)+(VA-VB) \quad (19)$$

Subsequently, calculation of the common voltage VX on the input side in the period 3, in which electric charge redistribution is implemented, will be described. When the common mode noise ΔV is overlapped on the assembled battery 1 during the electric charge of the first capacitor C1x, the general formula of conservation of electric charge in the period 2 and the period 3 becomes the formula (20) and the formula (21). The differential output voltage VOP−VOM in this case is the same as that of the formula (19).

$$C1(Vn+\Delta V-VCOM)+C2(VA-VCOM)=C1(VY-VX)+C2(VOP-VX) \quad (20)$$

$$C1(Vn-1+\Delta V-VCOM)+C2(VB-VCOM)=C1(VY-VX)+C2(VOM-VX) \quad (21)$$

The formula (22) is derived by adding the formula (20) to the formula (21).

$$2(C1+C2)VX=2C1\,VY+2(C1+2C2)VCOM-C1(Vn+Vn-1)-2C1\,\Delta V-C2(VA+VB) \quad (22)$$

In the case of C1=C2, the formula (22) becomes the formula (23).

$$4VX=2VY+6VCOM-(Vn+Vn-1)-2\Delta V-(VA+VB) \quad (23)$$

The voltage VY becomes the center voltage between the voltage Vn and the voltage Vn−1, as represented by the formula (24).

$$VY=(Vn+Vn-1+2\Delta V)/2 \quad (24)$$

The formula (25) representing the common voltage VX on the input side is derived from the formula (23) and the formula (24).

$$VX=(6VCOM-(VA+VB))/4 \quad (25)$$

That is, even when a common mode noise is overlapped on the assembled battery 1 during the electric charge of the first capacitor C1x, the common mode noise does not exert influence to the common voltage VX on the input side at the time of the electric charge redistribution. In the period 3, in which the first switch device SW1x is deactivated and the second switch device SW2x is activated, the connection node between the first capacitors C1x is disconnected from the battery cell Bn to be in a floating state. Therefore, even when a common mode noise is overlapped on the assembled battery 1 at the time of the electric charge redistribution, the common mode noise does not exert influence to the common voltage VX on the input side.

As described above, according to the present embodiment, when a common mode noise is overlapped on the assembled battery 1 during the charge of the first capacitor C1x and even when a common mode noise is overlapped on the assembled battery 1 during the electric charge redistribution, the common mode noise can be cancelled from the differential output voltage VOP−VOM and the common voltage VX on the input side of the operational amplifier 42. In addition, similar effect to the third embodiment can be produced for an error such as feed through and influence of the offset voltage ΔVOS of the operational amplifier 42.

(Fifth Embodiment)

Figure 13:
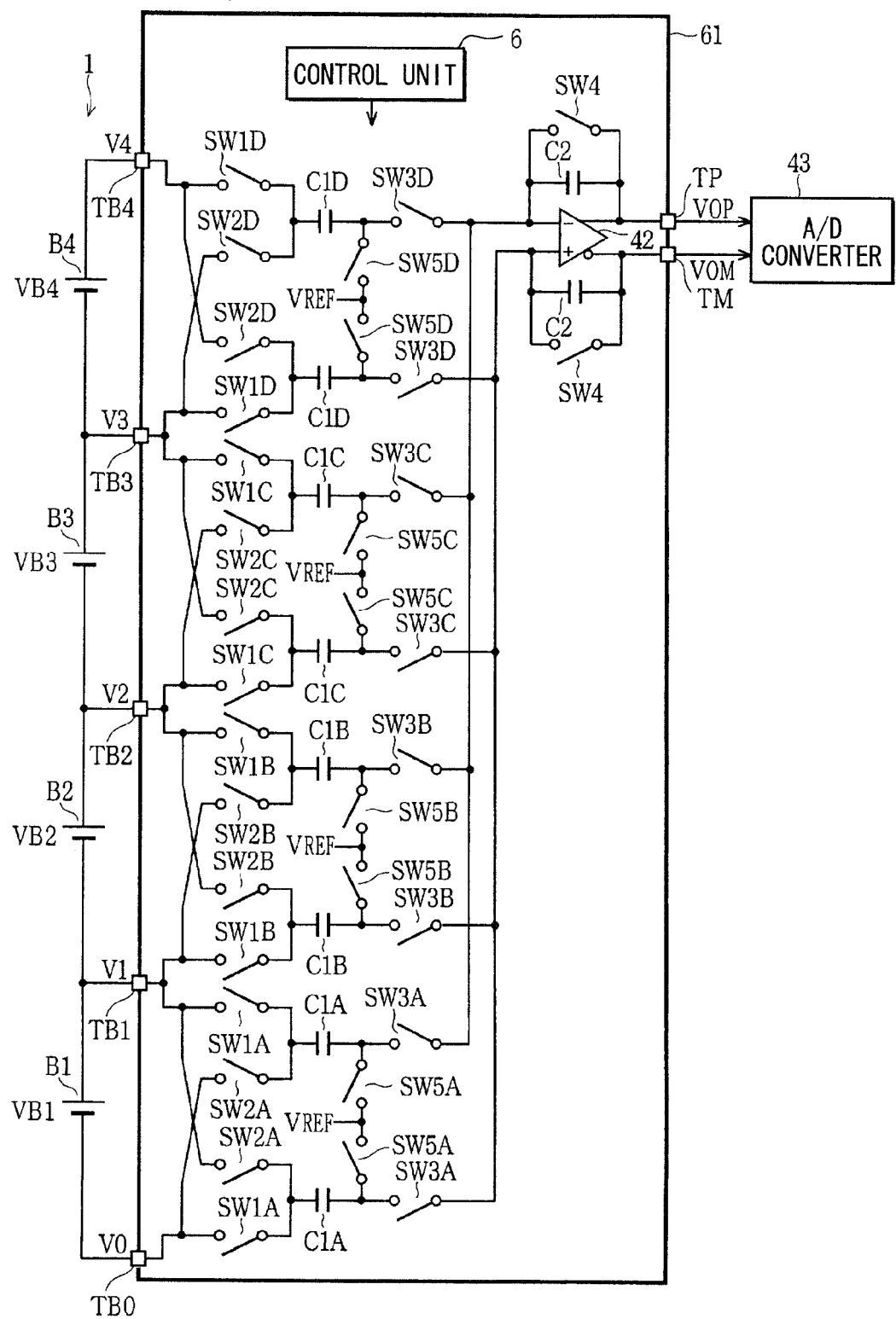
FIG. 13 is a block diagram showing the voltage detection device according to the fifth embodiment.
Figure 14:
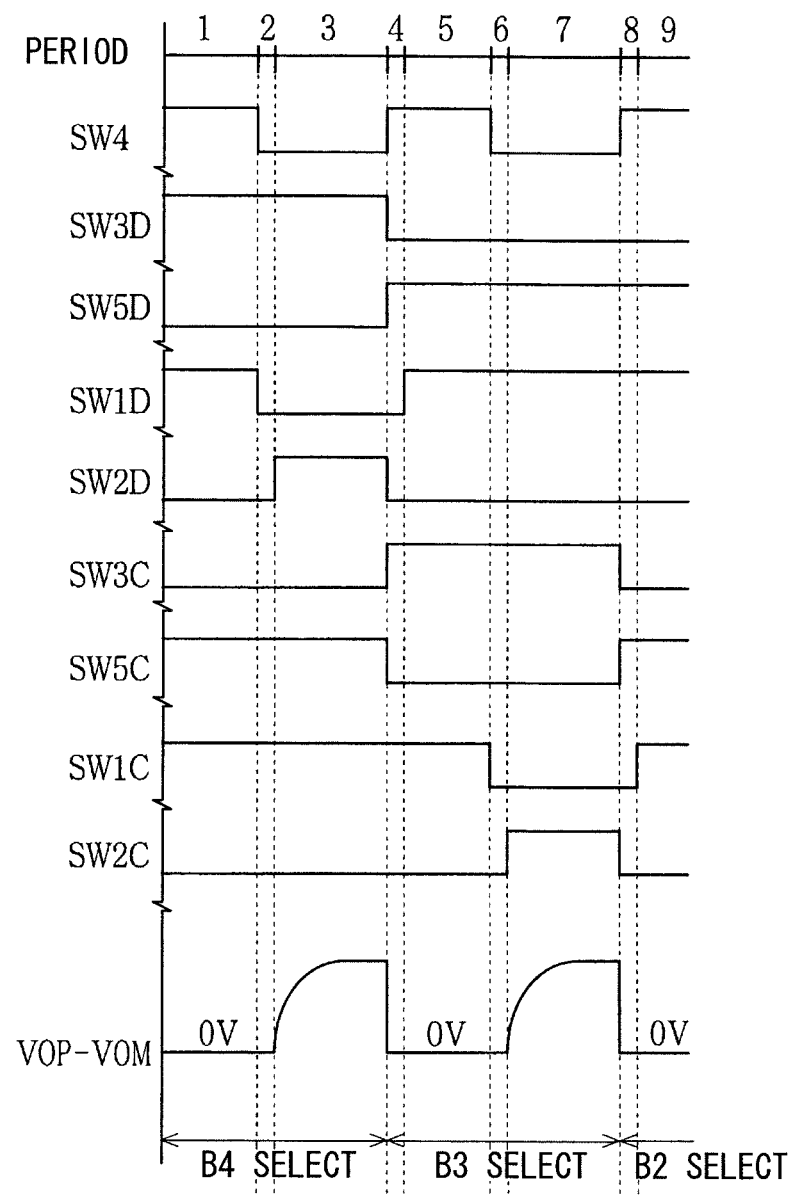
FIG. 14 is a timing chart showing the waveforms representing the ON/OFF states of the switch devices and the output voltage, according to the fifth embodiment.

The voltage detection device 61 shown in FIG. 13 has a configuration of the voltage detection device 2 of the first embodiment employing a fully-differential configuration. FIG. 14 shows waveforms representing the ON/OFF states of the switch devices and the output voltage VOP–VOM. The control of the switch devices is similar to that of the first embodiment. The formula (26) represents the differential output voltage VOP–VOM of the operational amplifier 42.

$$VOP-VOM=2C1/C2(Vn-Vn-1) \quad (26)$$

According to the present embodiment, a similar effect to that of the third embodiment can be produced, excluding the cancellation of the influence of the offset voltage ΔVOS of the operational amplifier 42.

(Other Embodiments)

As described above, the embodiments of the present invention have been mentioned. It is noted that the present invention is not limited to the above embodiments. The present invention may be variously modified and may be in practiced use in a spirit of the present invention.

In each embodiment, it is not necessary to apply the voltage VREF for voltage clamp, and it is not necessary to add the fifth switch device SW5x. Even in this case, the operational amplifier and all the switch devices can be formed with low-voltage transistors. It is noted that the voltage VREF for voltage clamp and the fifth switch device SW5x are effective to clamp the electric potential of the other end of the first capacitor C1x thereby to implement the stable operation and to reduce the charge time of the first capacitor C1x.

The voltage for voltage clamp may be set at a different voltage from the reference voltage VREF of the operational amplifiers 4, 42. It is noted that setting of both the voltages at the same voltage is effective to reduce the charge time of the first capacitor C1x.

Summarizing the above embodiments, the voltage detection device, which is for the assembled battery 1 including multiple unit batteries B1, B2, B3, B4 connected in series, is configured to detect the voltage of each of the unit batteries of the assembled battery. The voltage detection device includes: the operational amplifier having the input terminal biased at the predetermined reference voltage; the first capacitors C1x provided respectively to the unit batteries B1, B2, B3, B4; the first switch devices SW1x each provided between the high-voltage-side terminal of corresponding one of the unit batteries B1, B2, B3, B4 and the one end of corresponding one of the first capacitors C1x; the second switch devices SW2x each provided between the low-voltage-side terminal of the corresponding one of the unit batteries B1, B2, B3, B4 and the one end of the corresponding one of the first capacitors C1x; the third switch device SW3x provided between the inverting input terminal of the operational amplifier 4 and the other end of corresponding one of the first capacitors C1x; the second capacitor C2 and the fourth switch device SW4 provided in parallel between the inverting input terminal of the operational amplifier 4 and the output terminal TP of the operational amplifier 4; and the control unit.

The control unit is further configured to: open both the second switch devices SW2x and the third switch devices SW3x corresponding to the unit batteries B1, B2, B3, B4 excluded from the object of the voltage detection; close the fourth switch device SW4 to discharge electric charge of the second capacitor C2; and close one of the first switch devices SW1x and one of the third switch devices SW3x corresponding to the one of the unit batteries B1, B2, B3, B4 being the object of voltage detection thereby to charge the corresponding one of the first capacitors C1x. It is noted that the number of the unit batteries B1, B2, B3, B4 excluded from the object of the voltage detection may be one, and the number of the unit battery B1, B2, B3, B4 being the object of the voltage detection may be two or more. In the present state, the second switch device is applied with only the voltage of the corresponding one of the unit batteries. In addition, the third switch device is applied with only the voltage of the corresponding one of the unit batteries being excluded from the object of the voltage detection.

Thereafter, the control unit is further configured to: open the fourth switch device SW4; and close one of the second switch devices SW2x corresponding to the one of the unit batteries B1, B2, B3, B4 being the object of voltage detection, instead of the one of the first switch devices SW1x. On assumption that the capacitances of the first and second capacitors are C1 and C2, and the reference voltage is, VREF, the output voltage of the operational amplifier caused by the electric charge redistribution is calculated by (C1/C2×unit battery voltage+VREF). In this case, the offset voltage of the operational amplifier also appears. In the present state, the first switch device corresponding to the unit battery being the object of the voltage detection is applied with only the voltage of the unit battery. The fourth switch device is applied with the voltage calculated by (C1/C2×unit battery voltage).

According to the present configuration, each of the first capacitors provided respectively to the unit battery is applied with the voltage difference between the electric potential of each unit battery and the reference voltage. Therefore, the high voltage caused by the electric potential of each unit battery is not applied to both the operational amplifier and the switch devices. Thus, the circuit including the operational amplifier and the switch devices can be constructed of low-voltage transistors, such as a 5V-system transistor and 3.3V-system transistor, without use of a high-voltage transistor. Thus, the layout area for the circuit can be reduced in this way, thereby to reduce the manufacturing cost.

The voltage detection device for the assembled battery may employ the fully-differential configuration. Specifically, the operational amplifier 42 may have the differential output configuration in which the reference voltage is the common voltage VCOM. In this case, the first capacitors C1x, the second capacitor C2, the first switch devices SW1x, and the fourth switch device SW4x are provided to each of: the side of the inverting input terminal and the noninverting output terminal of the operational amplifier 42; and the side of the inverting input terminal and the noninverting output terminal of the operational amplifier 42.

In this case, on the side of the inverting input terminal and the noninverting output terminal of the operational amplifier 42: each of the first switch devices SW1x is provided between the high-voltage-side terminal of corresponding one of the unit batteries B1, B2, B3, B4 and the one end of corresponding one of the first capacitors C1x; each of the second switch devices SW2x is provided between the low-voltage-side terminal of corresponding one of the unit batteries B1, B2, B3, B4 and the one end of corresponding one of the first capacitors C1x; each of the third switch devices SW3x is provided between the inverting input terminal of the operational amplifier 42 and the other end of corresponding one of the first capacitors C1x; and the second capacitor C2 and the fourth switch device SW4x are provided in parallel between the inverting input terminal of the operational amplifier 42 and the noninverting output terminal of the operational amplifier 42.

In this case, on the side of the noninverting input terminal and the inverting output terminal of the operational amplifier 42: each of the first switch devices SW1x is provided between the low-voltage-side terminal of corresponding one of the unit batteries B1, B2, B3, B4 and the one end of corresponding one of the first capacitors C1x; each of the second switch devices SW2x is provided between the high-voltage-side terminal of corresponding one of the unit batteries B1, B2, B3, B4 and the one end of corresponding one of the first capacitors C1x; each of the third switch devices SW3x is provided between the noninverting input terminal of the operational amplifier 42 and the other end of corresponding one of the first capacitors C1x; and the second capacitor C2 and the fourth switch device SW4x are provided in parallel between the noninverting input terminal of the operational amplifier 42 and the inverting output terminal of the operational amplifier 42.

With the present fully-differential configuration, a common mode noise is removable from the output voltage of the operational amplifier, when the first switch device is closed to charge the first capacitor, and when a common mode noise is overlapped on the assembled battery in the case where the second switch device is closed, instead of the first switch device, to cause the electric charge redistribution. Furthermore, the symmetrical circuit configuration is employed. Therefore, an error such as feed-through occurring during switching of each switch device can be cancelled. Thus, the voltage detection can be implemented with high accuracy.

The voltage detection device may further include the fifth switch devices SW5x each provided between the voltage line and the other end of corresponding one of the first capacitors C1x. In this case, the voltage line is applied with the voltage VREF for voltage clamp to cause the voltage difference relative to the reference voltage VREF. In this case, the voltage difference is less than or equal to the withstand voltage of the switch devices SW3x. In this case, the control unit is further configured to open both the second switch devices SW2x and the third switch devices SW3x corresponding to the unit batteries B1, B2, B3, B4 excluded from the object of the voltage detection; and close both the first switch devices SW1x and the fifth switch devices SW5x corresponding to the unit batteries B1, B2, B3, B4 excluded from the object of voltage detection to charge the corresponding one of the first capacitors C1x. In this case, the control unit is further configured to close the fourth switch device SW4; and close one of the first switch devices SW1x and one of the third switch devices SW3x corresponding to the one of the unit batteries B1, B2, B3, B4 being the object of voltage detection to charge the corresponding one of the first capacitors C1x.

In the present configuration, the fifth switch devices are provided respectively to the unit batteries. In this case, the fifth switch devices corresponding to the unit batteries excluded from the object of the voltage detection are closed thereby to clamp the electric potential of the other end of the corresponding first capacitors. In the present state, the first switch devices are also closed. Therefore, in the period in which the unit batteries are excluded from the object of the voltage detection, the corresponding first capacitors can be beforehand charged (preliminarily charged) by applying the voltage difference between the electric potential of the high-voltage-side terminal of the corresponding unit battery and the voltage for voltage clamp. In this way, the charge time for the first capacitors can be reduced when the corresponding unit battery becomes the object of the voltage detection.

In the voltage detection device, the voltage for voltage clamp may be set to be equal to the reference voltage. In this case, when the corresponding unit battery becomes the object of the voltage detection, the corresponding first capacitor is already charged with the electric charge, which is equal to the electric charge to be charged, by the preliminary charge of the first capacitor. In this way, the charge time for the corresponding first capacitor can be reduced to substantially zero when the corresponding unit battery becomes the object of the voltage detection.

The configurations of the second capacitor and the fourth switch device may be modified in the voltage detection device.

Specifically, the voltage detection device may include, in addition to the operational amplifier 4, the first capacitors C1x, the first switch devices SW1x and the second switch devices SW2x, and third switch device SW3x: the fourth A switch device SW4A provided in parallel between the inverting input terminal of the operational amplifier 4 and the output terminal of the operational amplifier 4; the second capacitor C2 and the fourth B switch device SW4B provided in series between the inverting input terminal of the operational amplifier 4 and the output terminal TP of the operational amplifier 4; and the fourth C switch device SW4C provided between the common connection point, which is between the second capacitor C2 and the fourth B switch device SW4B, and the voltage line applied with the constant voltage VA.

In this case, the control unit is configured to open both the second switch devices SW2x and the third switch devices SW3x corresponding to the unit batteries B1, B2, B3, B4 excluded from an object of voltage detection; close both the fourth A switch device SW4A and the fourth C switch device SW4C; and open the fourth B switch device SW4B. In this way, the control unit charges the second capacitors with the electric charge according to (constant voltage−reference voltage+offset voltage of operational amplifier). In the present state, the second switch device is applied with only the voltage of the corresponding one of the unit batteries. In addition, the third switch device is applied with only the voltage of the corresponding one of the unit batteries being excluded from the object of the voltage detection.

Thereafter, the control unit is further configured to: open both the fourth A switch device SW4A and the fourth C switch device SW4C; close the fourth B switch device SW4B; and close one of the second switch devices SW2x corresponding to the one of the unit batteries B1, B2, B3, B4 being the object of voltage detection, instead of the one of the first switch devices SW1x. Thus, the control unit detects the voltage. When the constant voltage is VA, the output voltage of the operational amplifier caused by the redistribution becomes (C1/C2×unit battery voltage+VA). In the present state, the first switch device corresponding to the unit battery being the object of the voltage detection is applied with only the voltage of the unit battery. The fourth A switch device and the fourth C switch device are applied with the voltage calculated by (C1/C2×unit battery voltage). According to the present configuration, a similar effect to that of the above-described voltage detection device can be produced. In addition, the offset voltage of the operational amplifier can be removed from the detection voltage of the unit battery.

The above-described voltage detection device for the assembled battery may employ the fully-differential configuration. Specifically, the operational amplifier 42 may have the differential output configuration in which the reference voltage VREF is the common voltage VCOM. In this case, the first capacitors C1x, the second capacitor C2, the first switch devices SW1x, the second switch devices SW2x, the third switch devices SW3x, the fourth A switch device SW4A, the fourth B switch device SW4B, and the fourth C switch device SW4C are provided to each of: the side of the inverting input terminal and the noninverting output terminal of the operational amplifier 42; and the side of the noninverting input terminal and the inverting output terminal of the operational amplifier 42.

In this case, on the side of the inverting input terminal and the noninverting output terminal of the operational amplifier 42: each of the first switch devices SW1$x$ is provided between the high-voltage-side terminal of corresponding one of the unit batteries B1, B2, B3, B4 and the one end of corresponding one of the first capacitors C1$x$; each of the second switch devices SW2$x$ is provided between the low-voltage-side terminal of corresponding one of the unit batteries B1, B2, B3, B4 and the one end of corresponding one of the first capacitors C1$x$; each of the third switch devices SW3$x$ is provided between the inverting input terminal of the operational amplifier 42 and the other end of corresponding one of the first capacitors C1$x$; the fourth A switch device SW4A is provided between the inverting input terminal of the operational amplifier 42 and the noninverting output terminal of the operational amplifier 42; the second capacitor C2 and the fourth B switch device SW4B are provided in series between the inverting input terminal of the operational amplifier 42 and the noninverting output terminal of the operational amplifier 42; and the fourth C switch device SW4C is provided between the common connection point, which is between the second capacitor C2 and the fourth B switch device SW4B, and the voltage line applied with the constant voltage VA.

In this case, on the side of the noninverting input terminal and the inverting output terminal of the operational amplifier 42: each of the first switch devices SW1$x$ is provided between the low-voltage-side terminal of corresponding one of the unit batteries B1, B2, B3, B4 and the one end of corresponding one of the first capacitors C1$x$; each of the second switch devices SW2$x$ is provided between the high-voltage-side terminal of corresponding one of the unit batteries B1, B2, B3, B4 and the one end of corresponding one of the first capacitors C1$x$; each of the third switch devices SW3$x$ is provided between the noninverting input terminal of the operational amplifier 42 and the other end of corresponding one of the first capacitors C1$x$; the fourth A switch device SW4A is provided between the noninverting input terminal of the operational amplifier 42 and the inverting output terminal of the operational amplifier 42; the second capacitor C2 and the fourth B switch device SW4B are provided in series between the noninverting input terminal of the operational amplifier 42 and the inverting output terminal of the operational amplifier 42; and the fourth C switch device SW4C is provided between the common connection point, which is between the second capacitor C2 and the fourth B switch device SW4B, and the voltage line applied with the constant voltage VA. According to the present fully-differential configuration, a similar effect to that of the above-described voltage detection device can be produced. In addition, the offset voltage of the operational amplifier can be removed from the detection voltage of the unit battery.

The above-described voltage detection device for the assembled battery may employ the fully-differential configuration. Specifically, the voltage detection device may be modified to include the second switch devices commonly provided between the one end of the corresponding first capacitor C1$x$, which is provided on the side of the inverting input terminal of the operational amplifier 42, and the one end of the corresponding first capacitor C1$x$, which is provided on the side of the noninverting input terminal of the operational amplifier 42. The present configuration also produces a similar effect.

In addition, in the present configuration, the other end of the first capacitor is disconnected from the assembled battery to be in the floating state in the electric charge redistribution. Therefore, even in the case where a common mode noise is overlapped on the assembled battery when the first switch device is closed to charge the first capacitor and when the second switch device is closed to cause the electric charge redistribution, an influence of the common mode noise is removable from the common voltage of the input end of the operational amplifier.

The voltage detection device may further include the fifth switch devices SW5$x$ each provided between the voltage line and the other end of corresponding one of the first capacitors C1$x$. In this case, the voltage line is applied with the voltage VREF for voltage clamp to cause the voltage difference relative to the reference voltage VREF. In this case, the voltage difference is less than or equal to the withstand voltage of the switch devices SW3$x$. The control unit may be further configured to: open both the second switch devices SW2$x$ and the third switch devices SW3$x$ corresponding to the unit batteries B1, B2, B3, B4 excluded from the object of voltage detection; and close both the first switch devices SW1$x$ and the fifth switch devices SW5$x$ corresponding to the unit batteries B1, B2, B3, B4 excluded from the object of voltage detection to charge the corresponding one of the first capacitors C1$x$. The control unit may be further configured to: close both the fourth A switch device SW4A and the fourth C switch device SW4C; open the fourth B switch device SW4B; and close one of the first switch devices SW1$x$ and one of the third switch devices SW3$x$ corresponding to the one of the unit batteries B1, B2, B3, B4 being the object of voltage detection to charge the corresponding one of the first capacitors C1$x$. The present configuration also produces a similar effect.

In the voltage detection device, the voltage for voltage clamp may be set to be equal to the reference voltage. The present configuration also produces a similar effect.

The above structures of the embodiments can be combined as appropriate. The above processings such as calculations and determinations are not limited being executed by the control unit 6. The control unit may have various structures including the control unit 6 shown as an example.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:

1. A voltage detection device for an assembled battery including a plurality of unit batteries connected in series, the voltage detection device being configured to detect a voltage of each of the unit batteries of the assembled battery, the voltage detection device comprising:

an operational amplifier having an input terminal biased at a predetermined reference voltage;

first capacitors provided respectively to the unit batteries;

first switch devices each provided between a high-voltage-side terminal of corresponding one of the unit batteries and one end of corresponding one of the first capacitors;

second switch devices each provided between a low-voltage-side terminal of corresponding one of the unit batteries and the one end of corresponding one of the first capacitors;

third switch devices each provided between an inverting input terminal of the operational amplifier and an other end of corresponding one of the first capacitors;

a second capacitor and a fourth switch device provided in parallel between the inverting input terminal of the operational amplifier and an output terminal of the operational amplifier; and a control unit configured to detect the voltage by implementing the following first and second processes in order:

the first process to:
open both the second switch devices and the third switch devices corresponding to the unit batteries excluded from an object of voltage detection,
close the fourth switch device, and
close both one of the first switch devices and one of the third switch devices corresponding to one of the unit batteries being an object of voltage detection to charge corresponding one of the first capacitors; and the second process to:
open the fourth switch device, and
close one of the second switch devices corresponding to the one of the unit batteries being the object of voltage detection, instead of the one of the first switch devices.

2. The voltage detection device according to claim 1, wherein
the operational amplifier has a differential output configuration in which the reference voltage is a common voltage, the first capacitors, a second capacitor, the first switch devices, and a fourth switch device are provided to each of:
a side of an inverting input terminal and a noninverting output terminal of the operational amplifier; and
a side of a noninverting input terminal and an inverting output terminal of the operational amplifier,
on the side of the inverting input terminal and the noninverting output terminal of the operational amplifier:
each of the first switch devices is provided between the high-voltage-side terminal of corresponding one of the unit batteries and the one end of corresponding one of the first capacitors;
each of the second switch devices is provided between the low-voltage-side terminal of corresponding one of the unit batteries and the one end of corresponding one of the first capacitors;
each of the third switch devices is provided between the inverting input terminal of the operational amplifier and the other end of corresponding one of the first capacitors; and
the second capacitor and the fourth switch device are provided in parallel between the inverting input terminal of the operational amplifier and the noninverting output terminal of the operational amplifier,
on the side of the noninverting input terminal and the inverting output terminal of the operational amplifier:
each of the first switch devices is provided between the low-voltage-side terminal of corresponding one of the unit batteries and the one end of corresponding one of the first capacitors;
each of the second switch devices is provided between the high-voltage-side terminal of corresponding one of the unit batteries and the one end of corresponding one of the first capacitors;
each of the third switch devices is provided between the noninverting input terminal of the operational amplifier and the other end of corresponding one of the first capacitors; and
the second capacitor and the fourth switch device are provided in parallel between the noninverting input terminal of the operational amplifier and the inverting output terminal of the operational amplifier.

3. The voltage detection device according to claim 1, further comprising:
fifth switch devices each provided between a voltage line and the other end of corresponding one of the first capacitors, the voltage line being applied with a voltage for voltage clamp to cause a voltage difference relative to the reference voltage, the voltage difference being less than or equal to a withstand voltage of the switch devices,
the control unit is further configured to charge the corresponding one of the first capacitors by implementing the following third and fourth processes:
the third process to:
open both the second switch devices and the third switch devices corresponding to the unit batteries excluded from the object of voltage detection; and
close both the first switch devices and the fifth switch devices corresponding to the unit batteries excluded from the object of voltage detection; and
the fourth process to:
close the fourth switch device; and
close one of the first switch devices and one of the third switch devices corresponding to the one of the unit batteries being the object of voltage detection.

4. The voltage detection device according to claim 3, wherein the voltage for voltage clamp is set to be equal to the reference voltage.

5. A voltage detection device for an assembled battery including a plurality of unit batteries connected in series, the voltage detection device being configured to detect a voltage of each of the unit batteries of the assembled battery, the voltage detection device comprising:
an operational amplifier having an input terminal biased at a predetermined reference voltage;
first capacitors provided respectively to the unit batteries;
first switch devices each provided between a high-voltage-side terminal of corresponding one of the unit batteries and one end of corresponding one of the first capacitors;
second switch devices each provided between a low-voltage-side terminal of corresponding one of the unit batteries and the one end of corresponding one of the first capacitors;
third switch device each provided between an inverting input terminal of the operational amplifier and an other end of corresponding one of the first capacitors;
a fourth A switch device provided in parallel between the inverting input terminal of the operational amplifier and an output terminal of the operational amplifier;

a second capacitor and a fourth B switch device provided in series between the inverting input terminal of the operational amplifier and the output terminal of the operational amplifier;

a fourth C switch device provided between a common connection point, which is between the second capacitor and the fourth B switch device, and a voltage line applied with a constant voltage;

a control unit configured to detect the voltage by implementing the following first and second processes in order:

the first process to:
open both the second switch devices and the third switch devices corresponding to the unit batteries excluded from an object of voltage detection;
close both the fourth A switch device and the fourth C switch device;
open the fourth B switch device; and
close both one of the first switch devices and one of the third switch devices corresponding to one of the unit batteries being an object of voltage detection to charge corresponding one of the first capacitors; and the second process to:
open both the fourth A switch device and the fourth C switch device;
close the fourth B switch device; and
close one of the second switch devices corresponding to the one of the unit batteries being the object of voltage detection, instead of the one of the first switch devices.

6. The voltage detection device according to claim 5, wherein the operational amplifier has a differential output configuration in which the reference voltage is a common voltage, the first capacitors, the second capacitor, the first switch devices, the second switch devices, the third switch devices, the fourth A switch device, the fourth B switch device, and the fourth C switch device are provided to each of:
a side of an inverting input terminal and a noninverting output terminal of the operational amplifier; and
a side of a noninverting input terminal and an inverting output terminal of the operational amplifier, on the side of the inverting input terminal and the noninverting output terminal of the operational amplifier:
each of the first switch devices is provided between the high-voltage-side terminal of corresponding one of the unit batteries and the one end of corresponding one of the first capacitors;
each of the second switch devices is provided between the low-voltage-side terminal of corresponding one of the unit batteries and the one end of corresponding one of the first capacitors;
each of the third switch devices is provided between the inverting input terminal of the operational amplifier and the other end of corresponding one of the first capacitors; and
the fourth A switch device is provided between the inverting input terminal of the operational amplifier and the noninverting output terminal of the operational amplifier;
the second capacitor and the fourth B switch device are provided in series between the inverting input terminal of the operational amplifier and the noninverting output terminal of the operational amplifier; and
the fourth C switch device is provided between the common connection point, which is between the second capacitor and the fourth B switch device, and the voltage line applied with the constant voltage, on the side of the noninverting input terminal and the inverting output terminal of the operational amplifier:
each of the first switch devices is provided between the low-voltage-side terminal of corresponding one of the unit batteries and the one end of corresponding one of the first capacitors;
each of the second switch devices is provided between the high-voltage-side terminal of corresponding one of the unit batteries and the one end of corresponding one of the first capacitors;
each of the third switch devices is provided between the noninverting input terminal of the operational amplifier and the other end of corresponding one of the first capacitors; and
the fourth A switch device is provided between the noninverting input terminal of the operational amplifier and the inverting output terminal of the operational amplifier;
the second capacitor and the fourth B switch device are provided in series between the noninverting input terminal of the operational amplifier and the inverting output terminal of the operational amplifier; and
the fourth C switch device is provided between the common connection point, which is between the second capacitor and the fourth B switch device, and the voltage line applied with the constant voltage.

7. The voltage detection device according to claim 5, wherein the operational amplifier has a differential output configuration in which the reference voltage is a common voltage, the first capacitors, the second capacitor, the first switch devices, the third switch devices, the fourth A switch device, the fourth B switch device, and the fourth C switch device are provided to each of:
a side of the inverting input terminal and the noninverting output terminal of the operational amplifier; and
a side of the noninverting input terminal and an inverting output terminal of the operational amplifier, the second switch devices are, instead of being provided to each of, provided commonly to:
the side of the inverting input terminal and the noninverting output terminal of the operational amplifier; and
the side of the noninverting input terminal and the inverting output terminal of the operational amplifier, on the side of the inverting input terminal and the noninverting output terminal of the operational amplifier:
the first switch devices are provided between the high-voltage-side terminal of corresponding one of the unit batteries and the one end of corresponding one of the first capacitors;
the third switch devices are provided between the inverting input terminal of the operational amplifier and the other end of corresponding one of the first capacitors;
the fourth A switch device is provided between the inverting input terminal of the operational amplifier and the noninverting output terminal of the operational amplifier;
the second capacitor and the fourth B switch device are provided in series between the inverting input terminal of the operational amplifier and the noninverting output terminal of the operational amplifier; and the fourth C switch device is provided between the common connection point, which is between the second capacitor and the fourth B switch device, and the voltage line applied with the constant voltage, on the side of the noninverting input terminal and the inverting output terminal of the operational amplifier:
the first switch devices are provided between the low-voltage-side terminal of corresponding one of the unit batteries and the one end of corresponding one of the first capacitors;
the third switch devices are provided between the noninverting input terminal of the operational amplifier and the other end of corresponding one of the first capacitors;
the fourth A switch device is provided between the noninverting input terminal of the operational amplifier and the inverting output terminal of the operational amplifier;
the second capacitor and the fourth B switch device are provided in series between the noninverting input terminal of the operational amplifier and the inverting output terminal of the operational amplifier; and
the fourth C switch device is provided between the common connection point, which is between the second capacitor and the fourth B switch device, and the voltage line applied with the constant voltage, and each of the second switch devices is provided commonly between one ends of corresponding two of the first capacitors respectively provided to the inverting input terminal of the operational amplifier and to the noninverting input terminal of the operational amplifier.

8. The voltage detection device according to claim 5, further comprising:
fifth switch devices each provided between a voltage line and the other end of corresponding one of the first capacitors, the voltage line being applied with a voltage for voltage clamp to cause a voltage difference relative to the reference voltage, the voltage difference being less than or equal to a withstand voltage of the switch devices, wherein
the control unit is further configured to charge the corresponding one of the first capacitors by implementing the following third and fourth processes:
the third process to:
open both the second switch devices and the third switch devices corresponding to the unit batteries excluded from the object of voltage detection; and
close both the first switch devices and the fifth switch devices corresponding to the unit batteries excluded from the object of voltage detection; and
the fourth process to:
close both the fourth A switch device and the fourth C switch device;
open the fourth B switch device; and
close one of the first switch devices and one of the third switch devices corresponding to the one of the unit batteries being the object of voltage detection.

9. The voltage detection device according to claim 8, wherein the voltage for voltage clamp is set to be equal to the reference voltage.

* * * * *